United States Patent
Yonekura et al.

(10) Patent No.: US 11,506,645 B2
(45) Date of Patent: Nov. 22, 2022

(54) DEVICE WITH DEUTERIUM LAMP AND LIQUID CHROMATOGRAPH

(71) Applicant: Shimadzu Corporation, Kyoto (JP)

(72) Inventors: Takuya Yonekura, Kyoto (JP); Yugo Ishihara, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 178 days.

(21) Appl. No.: 17/054,930

(22) PCT Filed: Dec. 9, 2018

(86) PCT No.: PCT/JP2018/046720
§ 371 (c)(1),
(2) Date: Nov. 12, 2020

(87) PCT Pub. No.: WO2019/225044
PCT Pub. Date: Nov. 28, 2019

(65) Prior Publication Data
US 2021/0255154 A1  Aug. 19, 2021

(30) Foreign Application Priority Data

May 23, 2018 (JP) .............................. JP2018-098470

(51) Int. Cl.
*G01N 30/86* (2006.01)
*G01N 30/74* (2006.01)
*G01R 31/44* (2020.01)

(52) U.S. Cl.
CPC ......... *G01N 30/8665* (2013.01); *G01N 30/74* (2013.01); *G01R 31/44* (2013.01)

(58) Field of Classification Search
CPC .... G01N 30/8665; G01N 30/74; G01R 31/44; G01J 3/10; H05B 41/23
See application file for complete search history.

(56) References Cited

U.S. PATENT DOCUMENTS

2010/0201956 A1* 8/2010 Kimura .................. H05B 47/20
353/85

FOREIGN PATENT DOCUMENTS

| JP | 2008293837 A | * | 12/2008 | |
| JP | 2010182592 A | * | 8/2010 | ......... G03B 21/2093 |
| JP | 2014-085315 A | | 5/2014 | |

OTHER PUBLICATIONS

Written Opinion by the International Search Authority for PCT application No. PCT/JP2018/046720, dated Mar. 19, 2019, submitted with a machine translation.

* cited by examiner

*Primary Examiner* — Tarun Sinha
*Assistant Examiner* — James I Burris
(74) *Attorney, Agent, or Firm* — Muir Patent Law, PLLC

(57) ABSTRACT

The device is provided with a lamp lighting unit configured to perform an operation for lighting a deuterium lamp by controlling a lamp drive unit and a heater drive unit, an abnormality determination unit configured to determine, in a prescribed sequence, whether or not a voltage or a current detected by a lamp voltage detection unit, a lamp current detection unit, a heater voltage detection unit, and a heater current detection unit is abnormal, and an abnormality cause identification unit configured to identify, in a case the voltage or the current is determined to be abnormal by the abnormality determination, the cause of the abnormality, based on the timing at which the abnormality determination unit determines that the voltage or the current is abnormal.

5 Claims, 2 Drawing Sheets

DEVICE WITH DEUTERIUM LAMP AND LIQUID CHROMATOGRAPH

TECHNICAL FIELD

The present invention relates to a device equipped with a deuterium lamp as a light source, such as, e.g., an absorbance detector used as a detector for a liquid chromatography analysis, and a liquid chromatograph equipped with the device as a detector.

BACKGROUND ART

An absorbance detector is known as a detector for a liquid chromatography analysis. In some absorbance detectors, there is an absorbance detector in which a deuterium lamp is used as a light source. Such an absorbance detector is provided with an electric circuit for lighting a deuterium lamp (see Patent Document 1).

When lighting a deuterium lamp, first, the cathode of the deuterium lamp is preheated by a heater to emit thermoelectrons. In this state, a trigger voltage is applied between the anode and the cathode to generate an initial discharge between the anode and the cathode. When the initial discharge grows, and the impedance between the anode and the cathode decreases, the discharge between the anode and the cathode shifts to a main discharge. A predetermined current is caused to flow between the anode and the cathode when the impedance between the anode and the cathode drops to a predetermined value due to the main discharge to maintain the main discharge. As a result, the deuterium lamp is lit.

PRIOR ART DOCUMENT

Patent Document

Patent Document 1: Japanese Unexamined Patent Application Publication No. 2014-085315

SUMMARY OF THE INVENTION

Problems to be Solved by the Invention

In a device equipped with a deuterium lamp like the above-described absorbance detector, there are many abnormalities related to a deuterium lamp. Examples of abnormalities related to a deuterium lamp include an abnormality of an applied voltage to a heater, an abnormality of a current flowing through a heater, an abnormality of an applied voltage to a deuterium lamp, and an abnormality of a current flowing through a deuterium lamp. These abnormalities can be detected by monitoring the voltage or the current of the heater or the deuterium lamp.

However, even if an abnormality can be detected, it is difficult to identify whether or not the abnormality was caused by a malfunction of the deuterium lamp itself, or by a connection failure of the deuterium lamp, or by a malfunction of a circuit board for lighting the deuterium lamp.

Therefore, the present invention aims to facilitate the identification of a cause of an abnormality when the abnormality related to a deuterium lamp occurred.

Means for Solving the Problem

The present invention relates to a device in which a deuterium lamp provided with an anode and a cathode is used as a light source, the deuterium lamp being configured to emit light by discharging between the anode and the cathode. The device of the present invention includes:

a heater configured to preheat the deuterium lamp;

a lamp drive unit configured to apply a trigger voltage between the anode and the cathode of the deuterium lamp to cause a discharge and configured to flow a constant current between the anode and the cathode after generation of a main discharge between the anode and the cathode to maintain the main discharge;

a heater drive unit configured to drive the heater;

a lamp voltage detection unit configured to detect a voltage between the anode and the cathode of the deuterium lamp;

a lamp current detection unit configured to detect a current flowing between the anode and the cathode of the deuterium lamp;

a heater voltage detection unit configured to detect a voltage applied to the heater;

a heater current detection unit configured to detect a current flowing through the heater;

a lamp lighting unit configured to perform an operation for lighting the deuterium lamp by controlling the lamp drive unit and the heater drive unit;

an abnormality determination unit configured to determine, in a prescribed sequence, whether or not the voltage or the current detected by the lamp voltage detection unit, the lamp current detection unit, the heater voltage detection unit, and the heater current detection unit is abnormal, during the operation for lighting the deuterium lamp; and an abnormality cause identification unit configured to identify, in a case where the voltage or the current is determined to be abnormal by the abnormality determination unit, a cause of the abnormality, based on a timing at which the abnormality determination unit determines that the voltage or the current is abnormal.

In the device of the present invention, during the operation to light a deuterium lamp, in a prescribed sequence set so that the cause of the abnormality can be identified, it is determined whether or not there is any abnormality in the voltage or the current detected by the lamp voltage detection unit, the lamp current detection unit, the heater voltage detection unit, and the heater current detection unit. When an abnormality is detected, the cause of the abnormality is identified based on the timing at which the abnormality is detected, that is, at which stage of the predefined abnormality determination sequence the abnormality is detected.

In a preferred embodiment, the abnormality determination unit is configured to determine whether or not the voltage detected by the heater voltage detection unit or the voltage detected by the lamp voltage detection unit is abnormal, and determine, after determining that the voltage detected by the heater voltage detection unit and the voltage detected by the lamp voltage detection unit are normal, whether or not the current detected by the heater current detection unit is abnormal.

The abnormality cause identification unit is configured to identify, in a case where the voltage detected by the heater voltage detection unit or the voltage detected by the lamp voltage detection unit is determined to be abnormal by the abnormality determination unit, that the cause of the abnormality is a malfunction of a circuit board, and identify, in a case where the current detected by the heater current detection unit is determined to be abnormal by the abnormality determination unit, that the cause of the abnormality is a connection failure of the deuterium lamp or a lighting failure of the deuterium lamp.

Further, in a more preferred embodiment, the device further includes a lamp memory provided to the deuterium lamp, the lamp memory being configured to store information about the deuterium lamp. The abnormality determination unit is configured to determine, after determining that the voltage detected by the heater voltage detection unit and the voltage detected by the lamp voltage detection unit are normal, whether or not it is possible to read the information from the lamp memory.

The abnormality cause identification unit is configured to
- identify, in a case where it is determined that it is possible to read the information from the lamp memory and the current detected by the heater current detection unit is abnormal by the abnormality determination unit, that the cause of the abnormality is a lighting failure of the deuterium lamp, and
- identify, in a case where it is determined that it is impossible to read the information from the lamp memory and the current detected by the heater current detection unit is abnormal by the abnormality determination unit, that the cause of the abnormality is a connection failure of the deuterium lamp.

Further, the lamp lighting unit may be configured to apply, after the current detected by the heater current detection unit is determined to be normal by the abnormality determination unit, a trigger voltage between the anode and the cathode of the deuterium lamp by controlling the lamp drive unit. With this, a trigger voltage is applied in a state in which it is confirmed that there is no abnormality in the preheating of the deuterium lamp by the heater, which further facilitates the identification of the cause of the abnormality. In this case, preferably, the abnormality determination unit is configured to determine, after determining whether or not the current detected by the lamp current detection unit is abnormal after the trigger voltage is applied between the anode and the cathode of the deuterium lamp, whether or not the voltage detected by the lamp voltage detection unit is abnormal.

The abnormality cause identification unit is configured to
- identify, in a case where the voltage detected by the lamp voltage detection unit is determined to be abnormal by the abnormality determination unit despite whether or not the current detected by the lamp current detection unit is determined to be abnormal by the abnormality determination unit, that the cause of the abnormality is a malfunction of the circuit board, and
- identify, in a case where the current detected by the lamp current detection unit is determined to be abnormal by the abnormality determination unit and the voltage detected by the lamp voltage detection unit is determined to be normal by the abnormality determination unit, that the cause of the abnormality is a lighting failure of the deuterium lamp.

The device according to the present invention described above can be used as a detector for a liquid chromatograph.

Effects of the Invention

In the device of the present invention, during the operation for lightening a deuterium lamp, in a prescribed sequence set so that the cause of the abnormality can be identified, it is determined whether or not there is an abnormality in the voltage or the current detected by the lamp voltage detection unit, the lamp current detection unit, the heater voltage detection unit, and the heater current detection unit, and when an abnormality is detected, the cause of the abnormality related to the deuterium lamp is easily identified by the timing at which the abnormality is detected, that is, at which stage of the prescribed sequence the predetermined abnormality is detected.

EMBODIMENTS FOR CARRYING OUT THE INVENTION

Hereinafter, referring to the attached drawings, an example of a device equipped with a deuterium lamp will be described.

Figure 1:
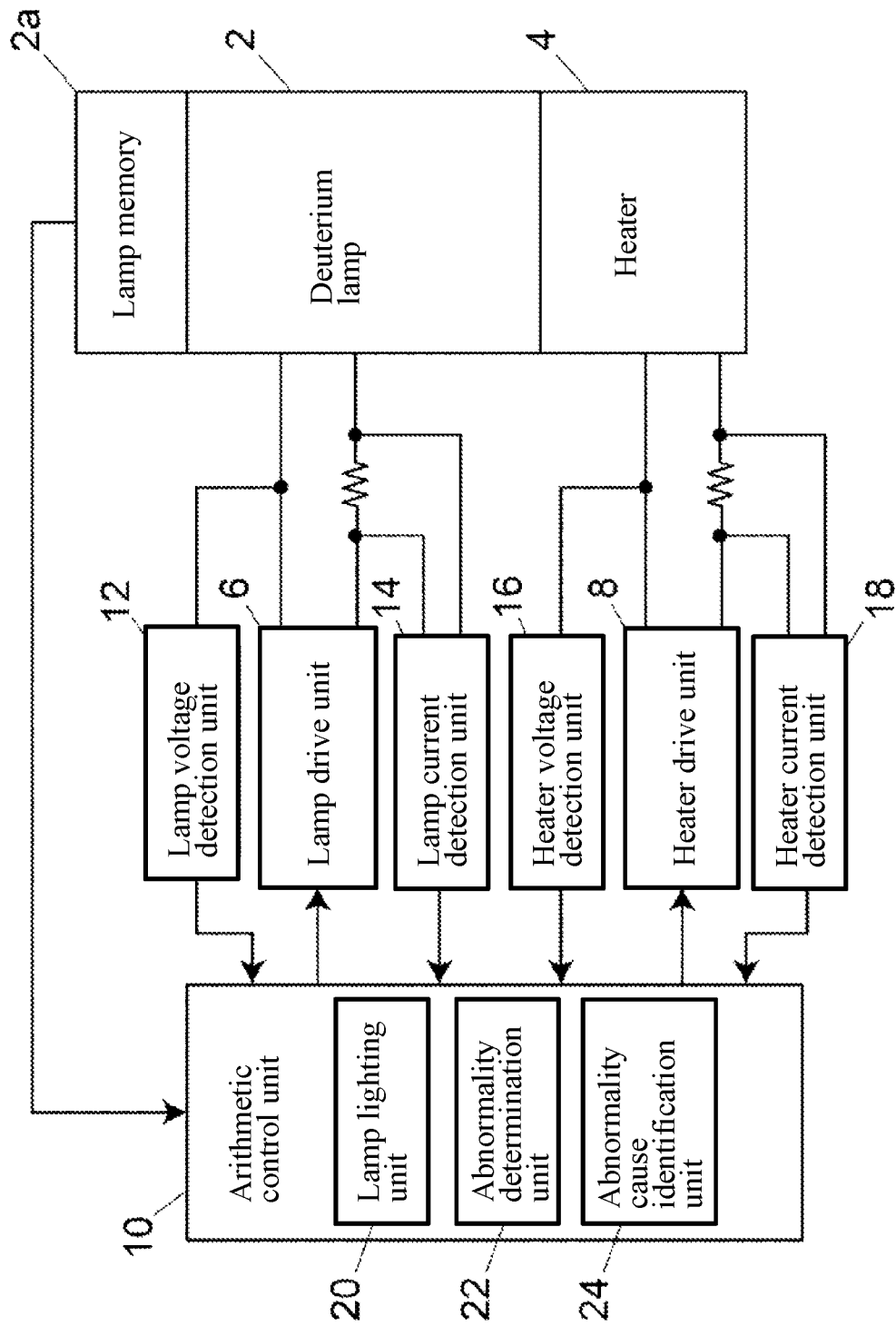
FIG. 1 is a block diagram schematically showing an example of a device equipped with a deuterium lamp.

As shown in FIG. 1, the device of this example is provided with a deuterium lamp 2, a heater 4, a lamp drive unit 6, a heater drive unit 8, an arithmetic control unit 10, a lamp voltage detection unit 12, a lamp current detection unit 14, a heater voltage detection unit 16, and a heater current detection unit 18. The deuterium lamp 2 is provided with a lamp memory 2a for storing information about the deuterium lamp 2, such as, e.g., identification information of the deuterium lamp 2.

The deuterium lamp 2 is provided with an anode and a cathode and is configured to generate a discharge between the anode and the cathode by the voltage applied by the lamp drive unit 6 to emit light. The lamp drive unit 6 is configured to cause to generate an initial discharge by applying a trigger voltage between the anode and the cathode of the deuterium lamp 2, and after the discharge between the anode and the cathode has grown to a main discharge, cause to flow a constant current between the anode and the cathode to maintain the main discharge.

The lamp memory 2a is configured to be electrically connected to the arithmetic control unit 10 when the deuterium lamp 2 is installed on the device and that the deuterium lamp 2 and the lamp drive unit 6 are electrically connected via a connector. When the deuterium lamp 2 is normally connected to the lamp drive unit 6, the arithmetic control unit 10 can read the information stored in the lamp memory 2a.

The heater 4 is for preheating the deuterium lamp 2 and is driven by the power supplied by the heater drive unit 8.

The lamp voltage detection unit 12 is for detecting the voltage applied between the anode and the cathode of the deuterium lamp 2. The lamp current detection unit 14 is for detecting the current flowing between the anode and the cathode of the deuterium lamp 2.

The heater voltage detection unit 16 is for detecting the voltage applied to the heater 4. The heater current detection unit 18 is for detecting the current flowing through the heater 4.

The operation of the lamp drive unit 6 and that of the heater drive unit 8 are controlled by the arithmetic control unit 10. The arithmetic control unit 10 is realized by an electric circuit including an arithmetic element and a storage element. The voltage and the current detected by the lamp voltage detection unit 12, the lamp current detection unit 14, the heater voltage detection unit 16, and the heater current detection unit 18 are read by the arithmetic control unit 10.

The arithmetic control unit 10 is provided with a lamp lighting unit 20, an abnormality determination unit 22, and an abnormality cause identification unit 24. The lamp lighting unit 20, the abnormality determination unit 22, and the abnormality cause identification unit 24 each are a function obtained by the execution of a program by the arithmetic element.

The lamp lighting unit 20 is configured to control the operations of the lamp drive unit 6 and the heater drive unit 8 to perform the operation of lighting the deuterium lamp 2. An example of the operation of lightening the deuterium lamp 2 will be described. First, the cathode of the deuterium lamp 2 is preheated by the heater 4 to release thermoelectrons. In this state, a trigger voltage is applied between the anode and the cathode to initiate discharging of the deuterium gas present between the anode and the cathode. Then, when the impedance between the anode and the cathode of the deuterium lamp 2 decreases and the discharge between the anode and the cathode shifts to a main discharge, a constant current is caused to flow between the anode and the cathode to maintain the main discharge to thereby light the deuterium lamp 2.

The abnormality determination unit 22 is configured to determine whether or not there exists an abnormality so that the cause of the abnormality can be determined in a prescribed sequence, for the voltage and the current in the deuterium lamp 2 and the heater 4 during the operation of lighting the deuterium lamp 2, based on the signals from the lamp voltage detection unit 12, the lamp current detection unit 14, the heater voltage detection unit 16, and the heater current detection unit 18.

The abnormality cause identification unit 24 is configured to identify the cause of the abnormality by the timing determined to be abnormal, in a case where the voltage or the current in the deuterium lamp 2 or the heater 4 is determined to be abnormal by the abnormality determination unit 22. In a preferred embodiment, the abnormality cause identification unit 24 is configured to display the determined cause of the abnormality, on a display device, such as, e.g., a liquid crystal display connected to the arithmetic control unit 10, when the determination of the abnormality is performed.

Figure 2:
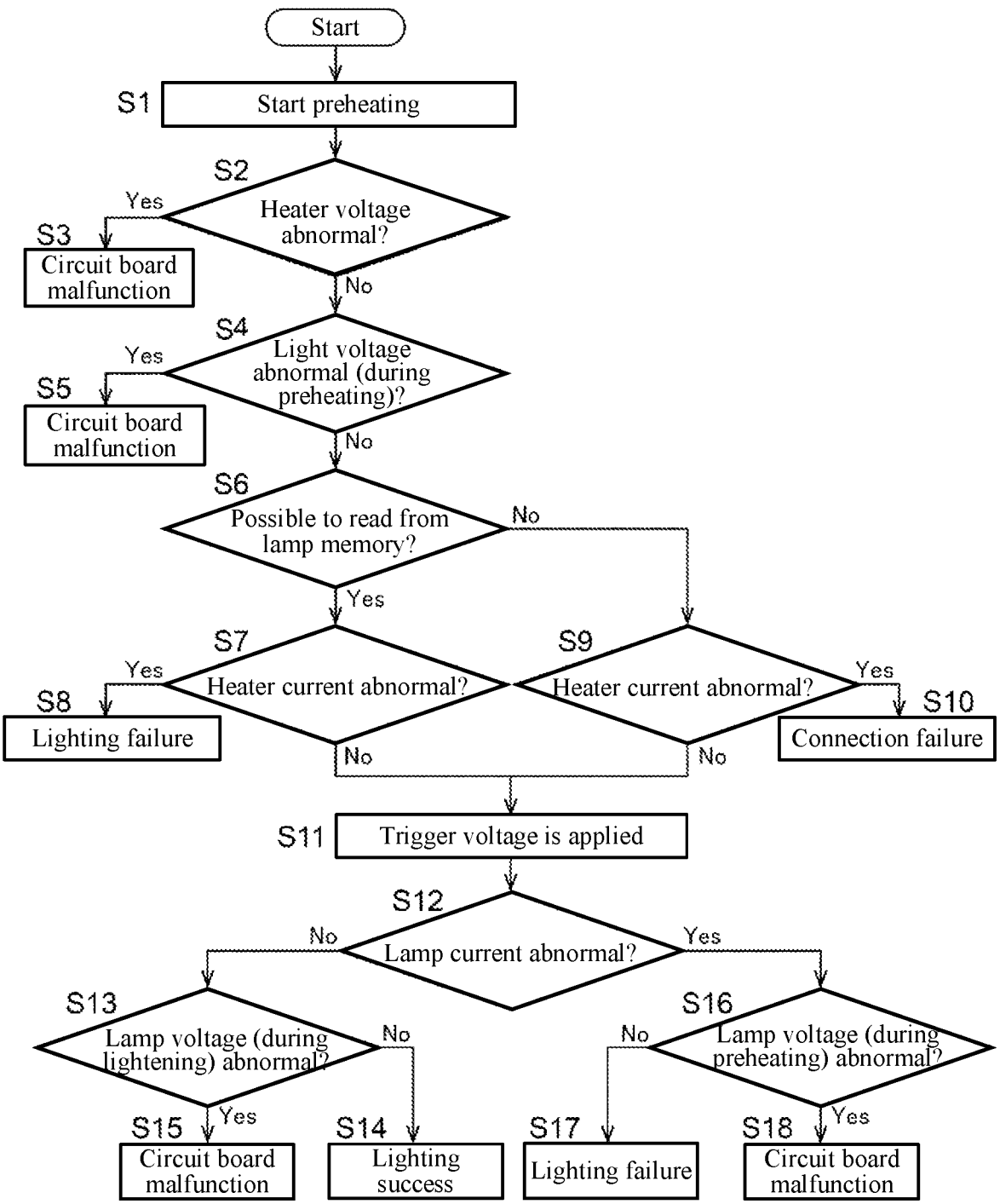
FIG. 2 is a flowchart showing identification of an abnormality during the lighting operation of the deuterium lamp in the example.

The operations of the abnormality determination and its cause identification during the operation of lighting the deuterium lamp 2 will be described with reference to the flowchart of FIG. 2.

First, the lamp lighting unit 20 starts preheating of the cathode of the deuterium lamp 2 by the heater 4 (Step S1). At this time, the abnormality determination unit 22 determines whether or not the applied voltage (heater voltage) to the heater 4 is abnormal, depending on whether or not the signal from the heater voltage detection unit 16 is within a predetermined range (Step S2). The abnormality determination unit 22 determines that the heater voltage is normal when the signal from the heater voltage detection unit 16 is within the predetermined range. And it determines that the heater voltage is abnormal when the signal is out of the predetermined range. When the abnormality determination unit 22 determines that the heater voltage is abnormal at this timing, the abnormality cause identification unit 24 identifies that the cause of the abnormality is a malfunction of any of the circuit boards constituting the heater drive unit 8, the arithmetic control unit 10, the heater voltage detection unit 16, and the like (Step S3).

When the heater voltage is normal, the abnormality determination unit 22 determines whether or not the applied voltage (lamp voltage (during the preheating)) to the deuterium lamp is abnormal, depending on whether or not the signal from the lamp voltage detection unit 12 is within the predetermined range as a reference during the preheating (Step S4). When the signal from the lamp voltage detection unit 12 is within the predetermined range, the abnormality determination unit 22 determines that the lamp voltage (during the preheating) is normal and determines that the lamp voltage (during the preheating) is abnormal when it is out of the predetermined range. When the abnormality determination unit 22 determines that the lamp voltage is abnormal at this timing, the abnormality cause identification unit 24 identifies that the reason for the abnormality is a malfunction of any of circuit boards constituting the lamp drive unit 6, the arithmetic control unit 10, and the lamp voltage detection unit 12 (Step S5). Note that the identification sequence of Steps S2 and S4 may be reversed. In other words, after performing the abnormal determination of the lamp voltage (during the preheating), the abnormal determination of the heater voltage may be performed.

When the lamp voltage is normal, the abnormality determination unit 22 determines whether or not it is possible to read the information from the lamp memory 2a (Step S6), and then determines whether or not the current (heater current) flowing through the heater 4 is abnormal, depending on whether or not the signal from the heater current detection unit 18 is within a predetermined range, regardless of whether or not it is possible to read the information from the lamp memory 2a (Steps S7 and S9). The abnormality determination unit 22 determines that the heater current is normal when the signal from the heater current detection unit 18 is within a predetermined range and determines that the heater current is abnormal when it is out of the predetermined range. When the heater current is abnormal although it is possible to read the information from the lamp memory 2a, the abnormality cause identification unit 24 identifies that the cause of the abnormality is a lighting failure of the deuterium lamp 2 itself (Steps S6, S7, S8). When it is impossible to read the information from the lamp memory 2a and the heater current is abnormal, the abnormality cause identification unit 24 identifies that the cause of the abnormality is due to a connection failure of any of circuit boards constituting the heater drive unit 8, the arithmetic control unit 10, and the heater voltage detection unit 16 or the like to the deuterium lamp 2 (Steps S6, S9, S10). The reason that the cause of the abnormality such as Step S8 or Step S10 can be determined is that the malfunction of the circuit board is eliminated from the cause of the abnormality because it is determined as No in Step S2 or Step S3. It should be noted that the sequence of the determination of Step S6 and the determinations of Step S7 and Step S9 may be reversed. In other words, when an abnormality of a heater current is found after the abnormality determination of the heater current is performed, it may be determined whether or not "it is possible to read from the lamp memory" and, when it is possible to read, it may be determined to be a "lighting failure (Step S8)", and when it is not possible to read, it may be determined to be a "connection failure (Step S10)".

When the heater current is normal, regardless of whether or not it is possible to read the data from the lamp memory 2a, the lamp lighting unit 20 applies a trigger voltage between the anode and the cathode of the deuterium lamp 2 (Step S11). Thereafter, the abnormality determination unit 22 detects the constant current (lamp current) flowing between the anode and the cathode of the deuterium lamp 2 by the lamp current detection unit 14 and determines whether or not the current is abnormal, depending on whether or not the lamp current is within the predetermined range (Step S12). The abnormality determination unit 22 determines that the lamp current is normal when the signal from the lamp current detection unit 14 is within the predetermined range, and determines that the lamp current is abnormal when it is out of the predetermined range.

When the lamp current is normal (Step S12), it can be determined that the deuterium lamp 2 is lighting. In this case, the abnormality determination unit 22 determines whether or not the applied voltage (lamp voltage (during the lightening)) to the deuterium lamp 2 is abnormal, depending on whether or not the signal from the lamp voltage detection unit 12 is within the prescribed range as a reference during the lighting of the deuterium lamp 2 (Step S13). When the lamp voltage (during the lightening) is normal, it is determined that the lighting of the deuterium lamp 2 is normal (Step S14). On the other hand, when the lamp voltage (during the lightening) is abnormal, the abnormality cause identification unit 24 identifies that the cause of the abnormality is a malfunction of any of circuit boards constituting the lamp drive unit 6 and the arithmetic control unit 10 (Step S15).

When the lamp current is abnormal (Step S12), it can be determined that the deuterium lamp 2 is not lighting. In this case, the abnormality determination unit 22 determines whether or not the lamp voltage (during the preheating) is abnormal (Step S16). When the lamp voltage (during the preheating) is normal, the abnormality cause identification unit 24 identifies that the cause of the abnormality of the lamp current is due to the lighting failure of the deuterium lamp 2 itself (Step S17). On the other hand, when the lamp voltage (during the preheating) is abnormal, the abnormality cause identification unit 24 identifies that the cause of the abnormality is a malfunction of any of circuit boards constituting the lamp drive unit 6, the arithmetic control unit 10, and the lamp current detection unit 14 (Step S18).

In the above example, for the lamp voltage, the lamp current, the heater voltage, and the heater current during the operation of lighting the deuterium lamp 2, it is determined whether or not it is abnormal in a prescribed sequence. When any abnormality is detected, the cause of the abnormality is automatically identified by the timing at which the abnormality is detected. Therefore, it is easy to identify the cause of the abnormality.

The device described above can be applied to a detector for a liquid chromatograph, such as, e.g., an absorbance detector using a deuterium lamp 2 as a light source. In other words, the device may be configured to emit the light emitted by the deuterium lamp 2 toward a sample cell through which an eluate from a separation column of a liquid chromatograph flows and to detect the intensity of the light transmitted through the sample cell by an optical sensor. By arranging the device configured as described above downstream of a separation column on an analytical channel of a liquid chromatograph, it can be used as a detector for a liquid chromatography. Note that a liquid chromatograph is provided with a liquid feed pump or for feeding a mobile phase in an analytical channel provided with a separation column or a detector and an autosampler for injecting a sample into an analytical channel.

DESCRIPTION OF SYMBOLS

2: Deuterium lamp
2a: Lamp memory
4: Heater
6: Lamp drive unit
8: Heater drive unit
10: Arithmetic control unit
12: Lamp voltage detection unit
14: Lamp current detection unit
16: Heater voltage detection unit
18: Heater current detection unit
20: Lamp lighting unit
22: Abnormality determination unit
24: Abnormality cause identification unit

The invention claimed is:

1. A device in which a deuterium lamp including an anode and a cathode is used as a light source, the deuterium lamp being configured to emit light by causing a discharge between the anode and the cathode, the device comprising:
  a heater configured to preheat the deuterium lamp;
  a lamp drive unit configured to apply a trigger voltage between the anode and the cathode of the deuterium lamp to cause a discharge and configured to flow a constant current between the anode and the cathode after generation of a main discharge between the anode and the cathode to maintain the main discharge;
  a heater drive unit configured to drive the heater;
  a lamp voltage detection unit configured to detect a voltage between the anode and the cathode of the deuterium lamp;
  a lamp current detection unit configured to detect a current flowing between the anode and the cathode of the deuterium lamp;
  a heater voltage detection unit configured to detect a voltage applied to the heater;
  a heater current detection unit configured to detect a current flowing through the heater;
  a lamp lighting unit configured to perform an operation for lighting the deuterium lamp by controlling the lamp drive unit and the heater drive unit;
  an abnormality determination unit configured to determine, in a prescribed sequence, whether or not the voltage or the current detected by the lamp voltage detection unit, the lamp current detection unit, the heater voltage detection unit, and the heater current detection unit is abnormal, during the operation for lighting the deuterium lamp; and
  an abnormality cause identification unit configured to identify, in a case where the voltage or the current is determined to be abnormal by the abnormality determination unit, a cause of the abnormality, based on a timing at which the abnormality determination unit determines that the voltage or the current is abnormal.

2. The device as recited in claim 1,
  wherein the abnormality determination unit is configured to
  determine whether or not the voltage detected by the heater voltage detection unit or the voltage detected by the lamp voltage detection unit is abnormal, and
  determine, after determining that the voltage detected by the heater voltage detection unit and the voltage detected by the lamp voltage detection unit are normal, whether or not the current detected by the heater current detection unit is abnormal, and
  wherein the abnormality cause identification unit is configured to
  identify, in a case where the voltage detected by the heater voltage detection unit or the voltage detected by the lamp voltage detection unit is determined to be abnormal by the abnormality determination unit, that the cause of the abnormality is a malfunction of a circuit board, and identify, in a case where the current detected by the heater current detection unit is determined to be abnormal by the abnormality determination unit, that the cause of the abnormality is a connection failure of the deuterium lamp or a lighting failure of the deuterium lamp.

3. The device as recited in claim 2, further comprising:

a lamp memory provided to the deuterium lamp, the lamp memory being configured to store information about the deuterium lamp, wherein the abnormality determination unit is configured to determine, after determining that the voltage detected by the heater voltage detection unit and the voltage detected by the lamp voltage detection unit are normal, whether or not it is possible to read the information from the lamp memory, and wherein the abnormality cause identification unit is configured to identify, in a case where it is determined that it is possible to read the information from the lamp memory and the current detected by the heater current detection unit is abnormal by the abnormality determination unit, that the cause of the abnormality is a lighting failure of the deuterium lamp, and identify, in a case where it is determined that it is impossible to read the information from the lamp memory and the current detected by the heater current detection unit is abnormal by the abnormality determination unit, that the cause of the abnormality is a connection failure of the deuterium lamp.

4. The device as recited in claim 2, wherein the lamp lighting unit is configured to apply, after the current detected by the heater current detection unit is determined to be normal by the abnormality determination unit, a trigger voltage between the anode and the cathode of the deuterium lamp by controlling the lamp drive unit, wherein the abnormality determination unit is configured to determine, after determining whether or not the current detected by the lamp current detection unit is abnormal after the trigger voltage is applied between the anode and the cathode of the deuterium lamp, whether or not the voltage detected by the lamp voltage detection unit is abnormal, and wherein the abnormality cause identification unit is configured to identify, in a case where the voltage detected by the lamp voltage detection unit is determined to be abnormal by the abnormality determination unit despite whether or not the current detected by the lamp current detection unit is determined to be abnormal by the abnormality determination unit, that the cause of the abnormality is a malfunction of the circuit board, and identify, in a case where the current detected by the lamp current detection unit is determined to be abnormal by the abnormality determination unit and the voltage detected by the lamp voltage detection unit is determined to be normal by the abnormality determination unit, that the cause of the abnormality is a lighting failure of the deuterium lamp.

5. A liquid chromatograph comprising: the device recited in claim 1.

* * * * *